United States Patent [19]
Fushimi et al.

[11] Patent Number: 4,990,776
[45] Date of Patent: Feb. 5, 1991

[54] ELECTRON MICROSCOPE

[75] Inventors: Satoru Fushimi; Hiroya Koshishiba, both of Yokohama, Japan

[73] Assignee: Hitachi, Ltd., Tokyo, Japan

[21] Appl. No.: 227,645

[22] Filed: Aug. 3, 1988

[30] Foreign Application Priority Data

Aug. 28, 1987 [JP] Japan .................. 62-212731

[51] Int. Cl.$^5$ .............................. H01J 37/26
[52] U.S. Cl. ................... 250/310; 250/311; 250/397
[58] Field of Search ............ 250/310, 397, 396 ML, 250/311, 491.1

[56] References Cited

U.S. PATENT DOCUMENTS

| | | | |
|---|---|---|---|
| 4,115,802 | 9/1978 | Kramer et al. | 250/311 |
| 4,407,008 | 9/1983 | Schmidt et al. | 356/318 |
| 4,440,475 | 4/1984 | Colliaux | 250/310 |
| 4,537,477 | 8/1985 | Takagi et al. | 250/310 |
| 4,564,296 | 1/1986 | Oshida et al. | 356/381 |
| 4,725,722 | 2/1988 | Maeda et al. | 250/201 |

FOREIGN PATENT DOCUMENTS 58-48989 8/1979 Japan .

OTHER PUBLICATIONS

Goldstein et al., *Scanning Electron Microscopy and X-Ray Microanalysis*, 1981, pp. 14 and 17.

Primary Examiner—Jack I. Berman
Attorney, Agent, or Firm—Antonelli, Terry, Stout & Kraus

[57] ABSTRACT

An auto-focusing electron microscope used for the observation, measurement and/or checking of a circuit pattern or the like comprises an objective lens capable of changing a focal position of an electron beam, an optical system for projecting a light and shade pattern having a light-permeable portion and a light-shielding portion onto the surface of a specimen through the objective lens, and a detector for detecting the projected pattern while optically reflecting it, whereby focusing can be made while reducing any damage and/or charging of the specimen.

6 Claims, 4 Drawing Sheets

FIG. I
PRIOR ART

ELECTRON MICROSCOPE

BACKGROUND OF THE INVENTION

The present invention relates to an electron microscope, and more particularly to an auto-focusing electron microscope suitable for the observation, measurement and/or checking of a circuit pattern such as a semiconductor wafer, a transfer mask or the like.

As the conventional focusing method in an electron microscope is known a method shown in FIG. 1.10 on page 17 of "Scanning Electron Microscopy and X-ray Microanalysis" published by Plenum Press, New York on 1981 or a method disclosed in JP-B-58-48989.

Such a known focusing method in an electron microscope is shown in FIG. 1. In the figure, reference numeral 1 designates an electron gun, numeral 2 a condenser lens, numeral 3 a deflection coil, numeral 4 an objective lens, numeral 5 is a specimen, numeral 6 a specimen holder or table, numeral 7 an electron beam detector, numeral 8 a scanning signal generating circuit, numeral 9 an amplifier, numeral 10 an auto-focusing circuit, and numeral 11 a display. An electron beam generated from the electron gun is focused by virtue of the condenser lens 2 and the objective lens 4 onto the specimen 5 which is mounted on the specimen holder 6. When the specimen 5 has any fluctuation or non-uniformity in height, it is possible to focus the electron beam onto the specimen by changing a magnetization current for the objective lens 4.

When the specimen 5 is irradiated with the electron beam, secondary electrons and/or reflected electrons are generated depending on the composition and/or shape of the specimen and are detected by the electron beam detector 7. An output of the electron beam detector 7 is supplied through the amplifier 9 to a luminance modulation electrode of the display 11. Generally, the scanning signal generating circuit 8 generates sawtooth waves. An output of the scanning signal generating circuit 8 is supplied to the deflection coil 3 so that the electron beam is two-dimensional scanned on the specimen 5. The output of the scanning signal generating circuit 8 is also supplied to a deflection coil of the display 11 to scan a bright spot on the display 11 in synchronism with the scan of the electron beam on the specimen 5 so that an electroscopic detection image of the specimen is obtained on the display 11.

On the other hand, the auto-focusing circuit 10 changes the magnetization current of the objective lens 4 for every scan and receives a detection signal of the electron beam detector 7 to determine an in-focus position from the magnitude of a change in the detection signal or the value of differentiation of the detection signal and to supply to the objective lens 4 a magnetization current with which the electron beam is brought into the in-focus position.

In the above-described prior art, there is a problem that since it is necessary to irradiate the specimen with the electron beam several times until the in-focus position is obtained, the specimen is subjected to its damage and charging by the electron beam, thereby making it impossible to correctly detect a pattern when a semiconductor device or the like is to be observed, measured and/or checked. Also, there arises a problem that any focusing cannot be made for a specimen with no pattern such as a transfer mask for semiconductor device having a protection film formed thereon.

SUMMARY OF THE INVENTION

An object of the present invention is to provide an electron microscope in which focusing is possible and in which any charging and damage of a specimen due to irradiation thereof with an electron beam is reduced.

Another object of the invention is to provide an electron microscope in which focusing can be made even for a specimen having no pattern thereon.

A further object of the invention is to provide an electron microscope in which auto-focusing can be made with a high precision.

To attain the above objects, an electron microscope according to one aspect of the present invention comprises projection means for projecting a light and shade pattern having a transparent or light-permeable portion and a light-shielding portion onto the surface of a specimen through an objective lens capable of changing a focal position of an electron beam, and detection means for optically reflecting the projected pattern and detecting it.

The focusing of the electron beam for the specimen is performed by controlling the objective lens in accordance with a signal detected by the detection means.

In an electron microscope according to another aspect of the present invention, a reflection type of optical objective lens having an electron-permeable hole at a central portion thereof is incorporated in a magnetic objective lens. A stripe pattern is projected with light in a predetermined wavelength region (for example, visible light) onto a specimen through the optical objective lens. The stripe pattern projected on the specimen is detected by, for example, two image sensors which are disposed with an image plane of the optical objective lens interposed therebetween and at front and rear positions shifted from each other along an optical axis. An in-focus position is determined from a difference between stripe pattern contrast signals on the two image sensors. As an electron beam detector is used a scintillator which is not excited by the light used for projecting the stripe pattern and the emission wavelength region of which is different from the wavelength region of the stripe pattern projecting light (for example, in an ultraviolet region). Light emitted from the scintillator is detected by a photomultiplier through a filter which does not pass the stripe pattern projecting light therethrough.

DESCRIPTION OF THE PREFERRED EMBODIMENTS

The present invention will now be explained in reference to embodiments thereof shown in the accompanying drawings.

Figure 1:
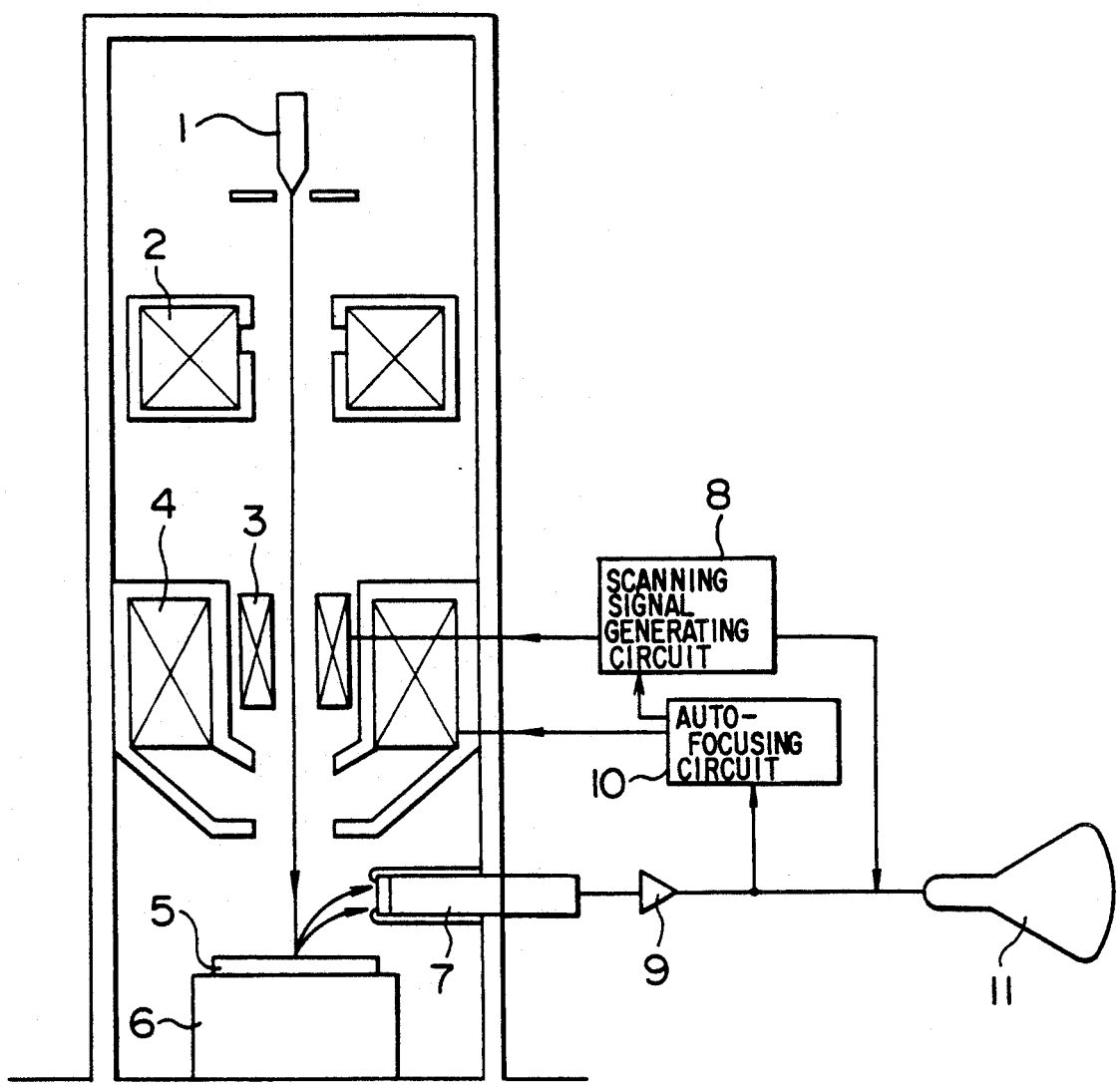
FIG. 1 is a schematic diagram showing the construction of the conventional scanning electron microscope.
Figure 2:
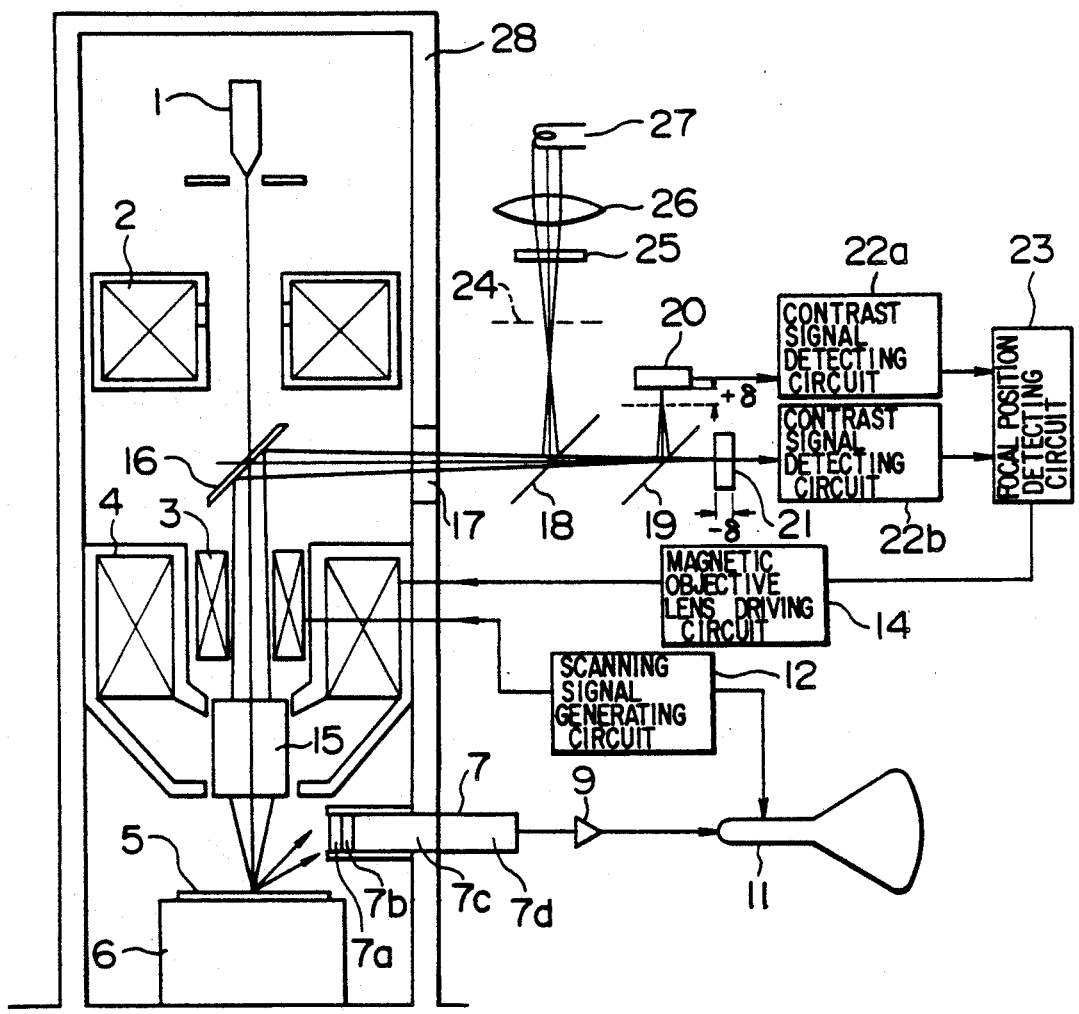
FIG. 2 is a schematic diagram showing the construction of an electron microscope according to an embodiment of the present invention.
Figure 3:
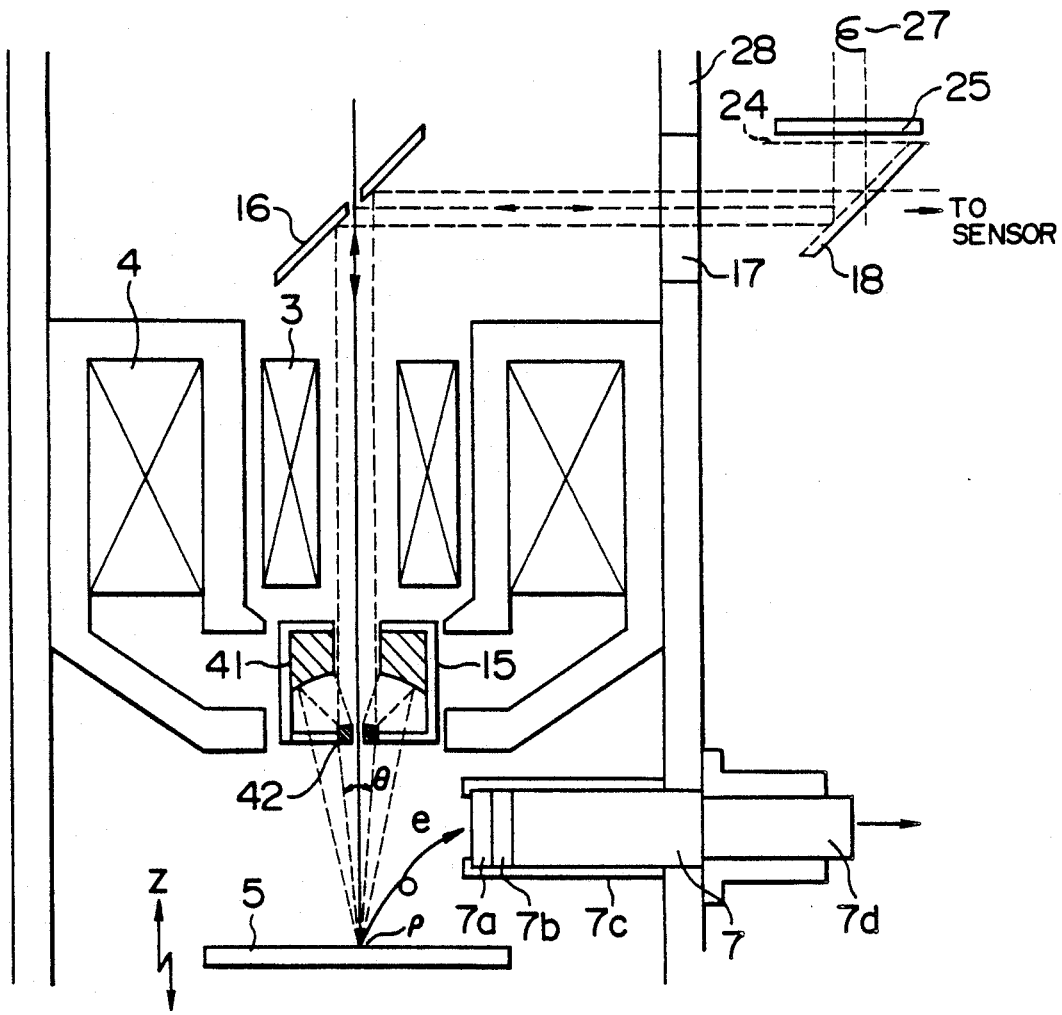
FIG. 3 is an enlarged view schematically showing the construction of an objective lens section shown in FIG. 2.

FIG. 2 is a schematic diagram showing the construction of the main part of an electron microscope according to the present invention and FIG. 3 is an enlarged view of an objective lens section shown in FIG. 2. In the figures, reference numeral 1 designates an electron gun for generating an electron beam, numeral 2 a condensor lens for condensing the electron beam generated from the electron gun 1, numeral 4 is a magnetic objective lens provided for changing a focal position (or focus position) of the electron beam, numeral 3 is a deflection coil for scanning the electron beam on a specimen 5 in a limited range, numeral 5 the specimen mounted on a specimen holder or table 6 which is movable in X- and Y-axis directions, and numeral 7 an electron beam detector for detecting secondary or reflected electrons from the specimen 5 or electrons transmitted through the specimen 5.

The electron beam detector 7 may include a scintillator 7a, a filter 7b, a light guide 7c and a photomultiplier 7d. Reference numeral 9 designates an amplifier. Numeral 11 designates a display as a monitor means for displaying a pattern on the specimen observed or measured by the electron beam detector 7. Numeral 12 designates a scanning signal generating circuit for supplying a scanning signal of, for example, sawtooth waveform to the deflection coil 3 and the display 11. Numeral 15 designates a reflection type of optical objective lens which constitutes a part of an optical projection and detection system for projecting a stripe pattern onto the specimen and detecting a contrast image from the specimen. The reflection type of optical objective lens 15 has the same optical axis and object (specimen) in-focus position as the magnetic objective lens controlled so as to focus the electron beam onto the specimen. The reflection type of optical objective lens 15 includes a concave mirror 41 and a convex mirror 42, as shown in FIG. 3. An illumination light enters at a hole provided at a central portion of the concave mirror 41, is reflected by the convex mirror 42 and illuminates the specimen by the concave mirror 41. The light reflected from the specimen 5 is reflected by the convex and concave mirrors 42 and 41 so that an optical image of the specimen 5 is obtained at a suitable position. In the present embodiment, a small hole (in order of 0.5 mm$\phi$) through which an electron beam can pass is provided at a central portion of the convex mirror 42. When the hole is provided at the central portion of the convex mirror 42, a portion of the reflected light from the specimen over an angle shown by $\theta$ in FIG. 3 is not detected. However, since the reflected light portion in a range of the angle $\theta$ is naturally intercepted by the convex mirror 42 itself, any deterioration of an optical detection image from the specimen 5 due to the provision of the hole at the central portion of the convex mirror 42 is almost negligible. Generally, the reflection mirrors 41 and 42 include metal surfaces, any charging of the lens resulting from the impingement of an electron beam thereupon can be avoided by grounding these metal surfaces.

An illumination light from a lamp 27 enters into the reflection type of optical objective lens 15 through a condenser lens 26, a filter 25, a stripe pattern 24, a half mirror 18, a glass window 17 and a reflection mirror 16. The reflected light from the specimen 5 is imaged by the reflection type of optical objective lens 15 and introduced through the reflection mirror 16, the glass window 17 and the half mirror 18 to a focal position detection system disposed behind the half mirror 18 and including components 19, 20, 21, 22a, 22b and 23 which will be explained hereinafter. A small hole through which an electron beam can pass is formed at a central portion of the reflection mirror 16. Like the small hole provided at the central portion of the reflection type of optical objective lens 15, the small hole provided at the central portion of the reflection mirror 16 does not almost give an influence on the optical detection image of the specimen 5.

Figure 4:
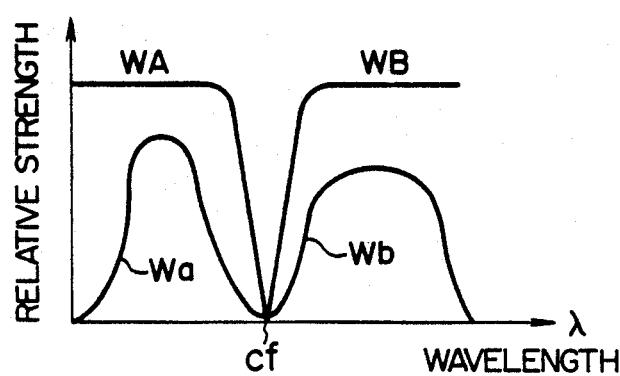
FIG. 4 is a view for explaining wavelength regions used in FIGS. 2 and 3.

An electron beam is focused onto the specimen through the small holes of the deflection mirror 16 and the reflection type optical objective lens 15. The magnetic objective lens 3 and the reflection type of optical objective lens 15 are designed such that the small hole provided in the reflection type of optical objective lens 15 serves as an objective diaphragm. With such a design, it is possible to prevent the small hole from disturbing the scan of the electron beam, and to prevent the objective diaphragm from obstructing the detection of an optical image. Reflected electrons and secondary electrons from the electrons impinging upon the specimen 5 excites the scintillator 7a which in turn emits light. As the scintillator 7a is used one which has an emission characteristic as shown by $W_a$ in FIG. 4. In the figure, the abscissa represents wavelength ($\lambda$) and the ordinate represents relative strength. On the other hand, the filter 25 is disposed for the provision of optical illumination in front of the lamp 27. As the filter 25 is used one which has a transmittance characteristic as shown by $W_B$ in FIG. 4 in order that the light emitted from the scintillator 7a of the electron beam detector 7 is not introduced into a case 28 of the microscope. Namely, the illumination light for the specimen 5 is provided with its spectral strength characteristic as shown by $W_b$ in FIG. 4 which does not overlap the emission wavelength characteristic $W_a$ of the scintillator 7a. The filter 7b disposed in rear of the scintillator 7a has a transmittance characteristic as shown by $W_A$ in FIG. 4. The light emitted from the scintillator 7a is detected by the photomultiplier 7d through the filter 7b and the light guide 7c. By thus separating the emission wavelength of the scintillator (and hence the sensitive wavelength of the photomultiplier) and the wavelength of the specimen illuminating light from each other, it is possible to simultaneously and independently carry out the detection of an optical image of the specimen and the detection of an electroscopic image thereof. Accordingly, if automatic detection of a focal position is made by use of optical means, it is not necessary to irradiate the specimen 5 with an electron beam for only the purpose of obtaining an in-focus position, which allow to minimize the damage of the specimen. Incidentally, the cutoff frequency is indicated as cf in FIG. 4.

Figure 5:
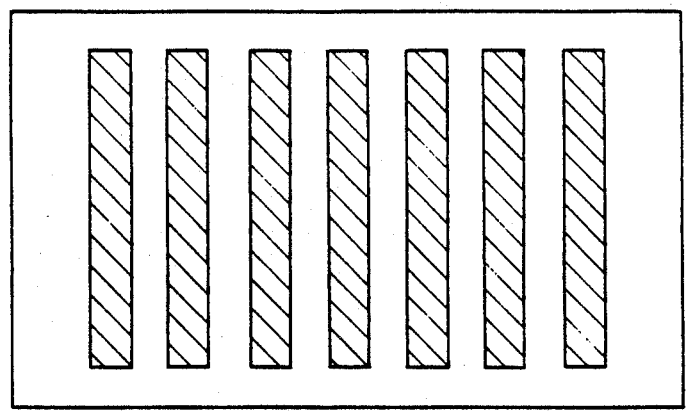
FIG. 5 is a view showing an example of a stripe pattern projected on a specimen in FIGS. 2 and 3.

As a method of optically detecting the focal position can be utilized techniques which are disclosed in, for example, JP-A-61-235808 or the corresponding U.S. Ser. No. 850,682 filed on Apr. 11, 1986 (now patented as U.S. Pat. No. 4,725,722). Namely, the stripe pattern 24 is projected onto an object (or the specimen 5) and an in-focus position is determined on the basis of a contrast signal of the projected stripe pattern. Detailed explanation will now be made referring to FIG. 2. The stripe pattern 24 is disposed in rear of the filter 25. An example of the stripe pattern 24 is shown in FIG. 5. In the figure, shaded portions are light-shielding portions and the remaining portion is a transparent or light-permeable portion. Returning to FIG. 2, reference numeral 19 designates a half mirror. Numerals 20 and 21 designate two-dimensional solid state image sensors which may be CCD's. A light receiving surface of the two-dimensional solid state image sensor 20 is disposed at a location displaced from a focal position (or an in-focus position) by $+\delta$ while a light receiving surface of the two-dimensional solid state imager is disposed at a location displaced from an image plane of the optical objective lens 15 (or an in-focus position) by $-\delta$. Numerals 22a and 22b designate contrast signal detecting circuits for converting video signals obtained by the two-dimensional solid state image sensors 20 and 21 into digital signals, respectively, and two-dimensionally integrating the digital signals to detect or obtain contrast signals $I_f$ and $I_b$. Numeral 23 designates a focal position detecting circuit which produces a difference $(I_f - I_b)$ between the contrast signals obtained from the contrast signal detecting circuits 22a and 22b. Numeral 14 designates a magnetic objective lens driving circuit which drives the magnetic objective lens 4 by adjusting an excitation current applied to the magnetic objective lens 4 in accordance with the output value from the focal position detecting circuit 23. thereby focusing the electron beam in an in-focus state on the specimen 5.

Figure 6:
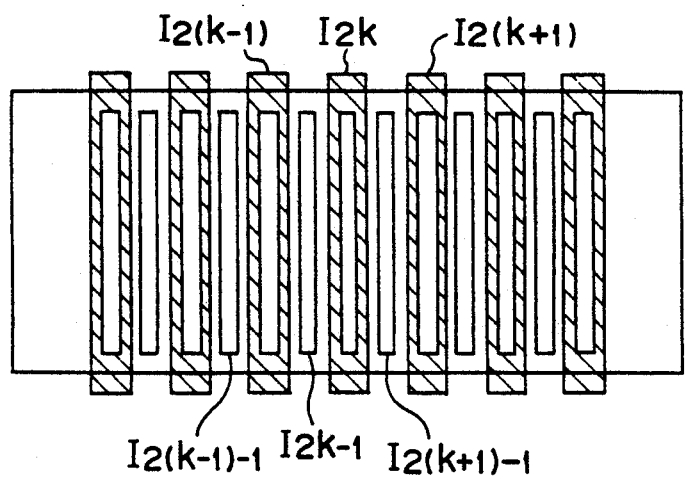
FIG. 6 is a view showing a stripe pattern imaged on a two-dimensional solid state imager.

Accordingly, an image of the stripe pattern is formed on the two-dimensional solid state imagers 20 and 21, as shown in FIG. 6 and the contrast signal detecting circuits 22a and 22b produce signals $I_f$ and $$I_b = \sum_{k=-m}^{+n} (I_{2k} - I_{2k-1})$$

Figure 7:
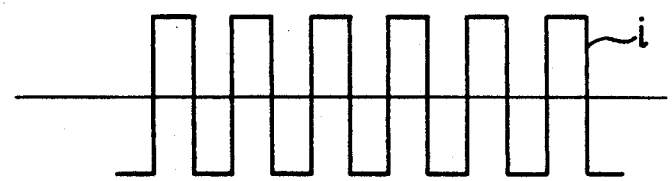
FIG. 7 is a view showing a video signal obtained from a two-dimensional imager shown in FIGS. 2 and 3.
Figure 8:
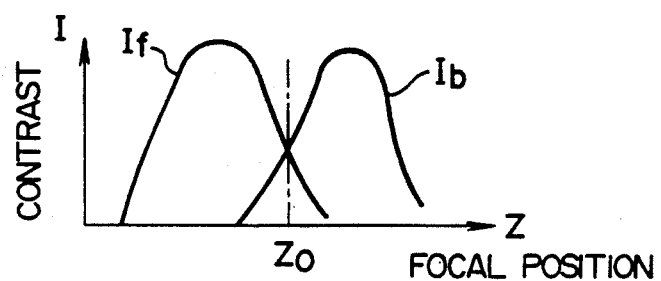
FIG. 8 is a view showing a relationship between a focal position Z and contrast signals $I_f$ and $I_b$ obtained from contrast signal detecting circuits shown in FIG. 2.

(see FIG. 7) obtained by integrating a difference signal between adjacent array sensors. The focal position detecting circuit 23 produces a difference $(I_f - I_b)$ between these contrast signals $I_f$ and $I_b$. FIG. 8 shows the relationship between the signals $I_f$ and $I_b$ and the focal position. Furthermore, the relationship between the excitation current of the magnetic objective lens 4 and the focal position of the electron beam is detected at the design stage of the objective lens. Therefore, the magnetic objective lens driving circuit 14 detects the current focal position from the difference value $(I_f - I_b)$, so that the circuit 14 can control the excitation current i such that the electron beam can be focused on the focal position obtained from the value $(I_f - I_b)$. In practice, the conversion from the value $I_f - I_b)$ to the current value i can be easily effected by using a ROM function table.

As has been mentioned above, according to the present embodiment, it is possible to control the electron beam to bring it into an in-focus state for the specimen at a position where the dimensions of a pattern on the specimen are to be measured, thereby, providing an electron microscope in which the measurement of the dimensions or the like can be realized with a high precision.

Also, it is possible to optically bring an electron beam into its in-focus state by controlling the electromagnetic objective lens and hence the specimen is neither damaged nor charged by the electron beam. Further, the observation, measurement, checking and/or the like of the specimen can be accurately made by means of the electron beam.

We claim:

1. An electron microscope comprising:
    an objective lens capable of changing a focal position of an electron beam;
    projection means for projecting a light and shade pattern having a light-permeable portion and a light-shielding portion onto the surface of a specimen through said objective lens; and
    detecting means for optically reflecting the projected pattern and detecting the projected pattern projected onto the surface of the specimen for enabling focusing of the electron beam onto the specimen.

2. An electron microscope according to claim 1, further comprising control means for controlling a focal position of said objective lens in accordance with a signal detected by said detection means.

3. An electron microscope comprising:
    an electromagnetic objective lens for changing a focal position of an electron beam;
    optical projection means provided for projecting a stripe pattern onto the surface of a specimen;
    detection means for detecting a contrast signal of the stripe pattern projected by said optical projection means; and
    control means for controlling said electromagnetic objective lens to perform the focusing of the electron beam onto the specimen in accordance with the contrast signal detected by said detection means.

4. An electron microscope according to claim 3, wherein a reflection type of optical objective lens having an electron-permeable hole formed at a central portion thereof is provided as said optical projection means and said detection means in said electromagnetic objective lens.

5. An electron microscope according to claim 4, further comprising means for projecting the stripe pattern onto the specimen through said reflection type of optical objective lens by light in a predetermined wavelength region, first and second image sensors disposed with an image plane of said reflection type of optical objective lens interposed therebetween and at front and rear positions shifted from each other along an optical axis for detecting the stripe pattern projected on the specimen, and focal position detecting means for determining an in-focus position from a difference between contrast signals of the stripe pattern on said first and second image sensors.

6. An electron microscope according to claim 5, further comprising electron beam detecting means including a scintillator which is not excited by the stripe pattern projecting light in said predetermined wavelength region and the emission wavelength region of which is different from said predetermined wavelength region of the stripe pattern projecting light, a filter which does not pass therethrough the stripe pattern projecting light in said predetermined wavelength region, and a photomultiplier which detects light from said scintillator through said filter.

* * * * *